(12) United States Patent
Tsubamoto

(10) Patent No.: US 8,227,709 B2
(45) Date of Patent: Jul. 24, 2012

(54) PRINTED WIRING BOARD, AND DESIGN METHOD FOR PRINTED WIRING BOARD

(75) Inventor: Daita Tsubamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 254 days.

(21) Appl. No.: 12/702,354

(22) Filed: Feb. 9, 2010

(65) Prior Publication Data

US 2010/0200287 A1 Aug. 12, 2010

(30) Foreign Application Priority Data

Feb. 9, 2009 (JP) ................................. 2009-026872

(51) Int. Cl.
*H05K 1/11* (2006.01)

(52) U.S. Cl. ........................................ 174/262; 174/258

(58) Field of Classification Search .................. 174/262, 174/250, 261, 113 R; 361/780, 794–796; 333/33

See application file for complete search history.

(56) References Cited

U.S. PATENT DOCUMENTS

| 6,388,208 B1 * | 5/2002 | Kiani et al. | 174/266 |
| 7,326,856 B2 * | 2/2008 | Takada | 174/250 |
| 2008/0066951 A1 * | 3/2008 | Goergen | 174/255 |

FOREIGN PATENT DOCUMENTS

| JP | 8-97564 | 4/1996 |
| JP | 2003-283093 | 10/2003 |

* cited by examiner

*Primary Examiner* — Yuriy Semeneko
(74) *Attorney, Agent, or Firm* — Fujitsu Patent Center

(57) ABSTRACT

A multi-layer printed wiring board includes a first insulating layer, a second insulating layer having a dissipation factor higher than a dissipation factor of the first insulating layer, a first conductive layer, and a first via connected to a lead wire in the first conductive layer. The first via includes a stub extending through the second insulating layer.

6 Claims, 11 Drawing Sheets

| DIELECTRIC DISSIPATION FACTOR OF CORRESPONDING LAYER | RESONANCE DEPTH |
|---|---|
| 0.02 | -27dB |
| 2.02 | -19dB |

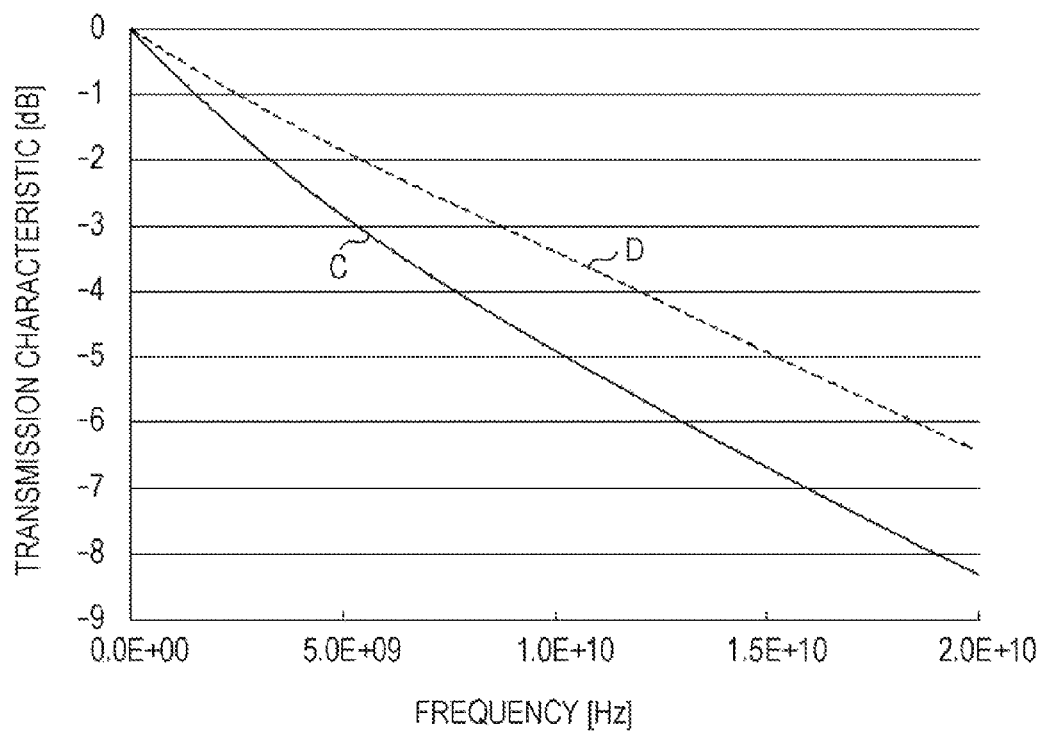

PRINTED WIRING BOARD, AND DESIGN METHOD FOR PRINTED WIRING BOARD

CROSS-REFERENCE TO RELATED APPLICATIONS

This application is based upon and claims the benefit of priority of the prior Japanese Patent Application No. 2009-26872, filed on Feb. 9, 2009, the entire contents of which are incorporated herein by reference.

FIELD

The embodiments discussed herein are related to a printed wiring board.

BACKGROUND

In recent years, the amount of information processing required for electronic apparatuses has steadily increased, and the signal speed in electronic apparatuses has significantly increased. Accordingly, the number of layers of a printed wiring board and the thickness thereof have also tended to increase. This causes an increase in the length of a via stub in a through-hole, resulting in the degradation of the signal quality in the via stub due to the resonance of the high-frequency (for example, several gigahertz) components. The via stub is a stub portion (open wiring portion) of a via. Conventionally, the via stub of the through-hole is drilled and removed to reduce the degradation of the signal quality.

Japanese Laid-open Patent Publications Nos. 2003-283093 and 8-97564 disclose a multi-layer printed wiring board with a reduced via stub of a through-hole or a multi-layer wiring board whose surface can be formed flat.

SUMMARY

According to an aspect of the invention, a multi-layer printed wiring board includes a first insulating layer, a second insulating layer having a dissipation factor higher than a dissipation factor of the first insulating layer, a first conductive layer including a lead wire, and a first via connected to the lead wire, the first via including a stub extending through the second insulating layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a graph illustrating an example of the effect of via clearance control;

FIG. 13 is a table illustrating an example of the effect of via clearance control;

DESCRIPTION OF EMBODIMENTS

The conventional back drilling techniques, which were previously described, involve an additional manufacturing process for performing a drilling operation. The additional manufacturing process results in an increase in cost. Further, back drilling causes a major wall surface of a through-hole to be drilled and exposed. As a result, a printed wiring board may suffer from moisture absorption in the exposed wall surface, and the characteristics thereof may be degraded.

The embodiments described below address the foregoing problems.

Figure 1:
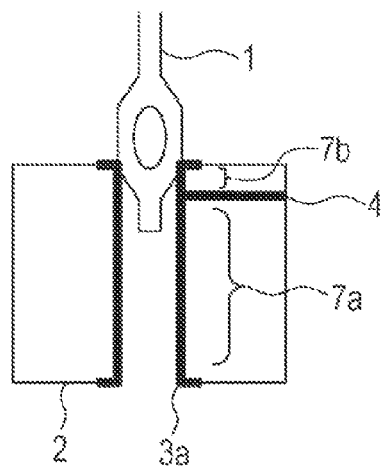
FIG. 1 is a cross-sectional view illustrating an example structure of a printed wiring board.

FIG. 1 is a cross-sectional view illustrating an example structure of a printed wiring board. The printed wiring board illustrated in FIG. 1 is a multi-layer substrate including a substrate 2 having a through-hole. The printed wiring board has a via 3a, which serves as a conductor, on a surface of the through-hole, and a lead wire 4 connected to the via 3a inside the substrate 2 in such a manner that the lead wire 4 is provided between layers. A terminal 1 of a component is mounted on the upper surface of the printed wiring board. The via 3a includes a connection path portion 7b and a via stub portion 7a. The connection path portion 7b corresponds to a portion of the via 3a between the lead wire 4 and a portion of the via 3a, which contacts the terminal 1. The via stub 7a is the portion of the via 3a between the lead wire 4 and the back surface of the surface of the substrate 2. The via stub 7a has an end that is not electrically connected to a component (e.g., an open end). Signal reflection occurs at the open end of the via stub 7a (the lower end of the via 3a).

Comparative Example

Here, back drilling, which is a technique for drilling and removing the via stub 7a, will be described as a comparative example to the present embodiments.

Figure 2A:
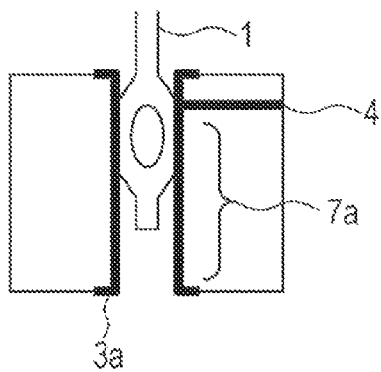
FIG. 2A is a cross-sectional view illustrating an example of back drilling in the related art.
Figure 2B:
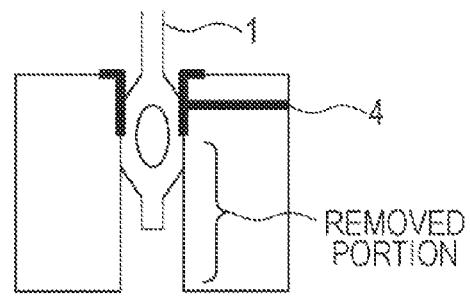
FIG. 2B is a cross-sectional view illustrating an example of back drilling in the related art.

FIGS. 2A and 2B are cross-sectional views describing back drilling. In FIGS. 2A and 2B, the same reference numerals as those in FIG. 1 represent the same or equivalent portions as or to those in FIG. 1. FIG. 2A is a cross-sectional view of the printed wiring board before back drilling. FIG. 2B is a cross-sectional view thereof after back drilling. As shown in FIG. 2B at least a portion of the via stub 7a is drilled and removed by back drilling.

First Embodiment

The printed wiring board of the present embodiment includes a multi-layer substrate. This substrate has a normal-loss portion (first insulating layer) and a high-loss portion (second insulating layer). In the substrate, the normal-loss portion is a portion made of an insulating material that is normal for a substrate. The high-loss portion is a portion made of an insulating material having a higher dissipation factor than the insulating material of the normal-loss portion. A printed wiring board formed of an insulating material having a high dissipation factor causes high losses at high frequencies. The high-loss portion is made of, for example, the material of the normal-loss portion mixed with carbon fiber as a filler.

Figure 3:
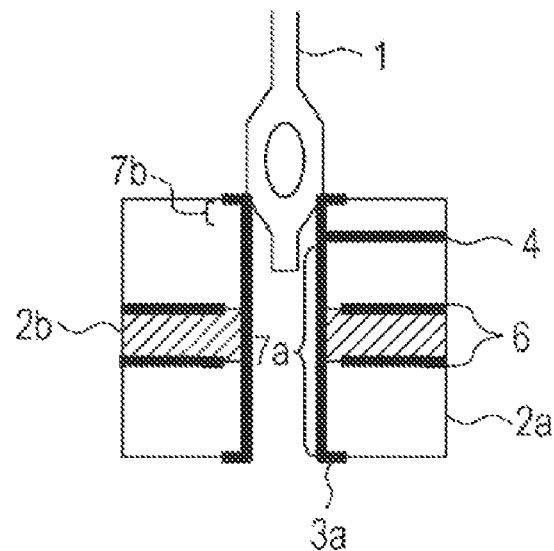
FIG. 3 is a cross-sectional view illustrating an example structure of a via having a via stub extending through a high-loss portion.

FIG. 3 is a cross-sectional view illustrating an example structure of a via having a via stub extending through a high-loss portion. In FIG. 3, the same reference numerals as those in FIG. 1 represent the same or equivalent portions as or to those in FIG. 1, and will not be discussed herein. A via 3a (first via) is provided on a surface of a through-hole. A lead wire 4 extends through an intermediate signal layer and is connected to an intermediate portion of the via 3a. A portion of the via 3a which is located above the lead wire 4 is referred to as a connection path portion 7b. The connection path portion 7b of the via 3a has an end electrically connected to a terminal 1 of a component. A portion of the via 3a which is located below the lead wire 4 is referred to as a via stub 7a.

As in this example, when the via stub 7a is long, large reflection occurs in the via stub 7a. When large reflection occurs in the via stub 7a, a high-loss portion 2b provided in a portion of the substrate through which the via stub 7a extends causes an increase in the loss of the high-frequency components during the charge/discharge of the via stub 7a. As such, the high-loss portion 2b serves to attenuate the high-frequency components that travel toward the open end of the via stub 7a and the high-frequency components that are reflected and return from the open end, thereby suppressing reflection.

Figure 4:
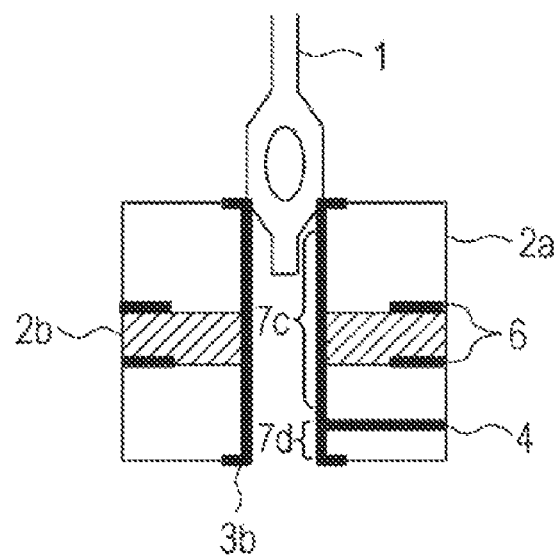
FIG. 4 is a cross-sectional view illustrating an example structure of a via having a connection path portion extending through a high-loss portion.

According to another example, there may be a via having a connection path portion that is longer than a via stub, in which the connection path portion extends through a high-loss portion. FIG. 4 is a cross-sectional view illustrating an example structure of a via having a connection path portion extending through a high-loss portion. In FIG. 4, the same reference numerals as those in FIG. 1 represent the same or equivalent portions as or to those in FIG. 1, and will not be discussed herein. As in this example, when a via stub 7d of a via 3b (second via) is short, small reflection occurs in the via stub 7d. As in this example, in the structure in which a connection path portion 7c extends through a high-loss portion 2b, the losses of the high-frequency components may be increased more than necessary, which may result in the degradation of the signal quality.

To reduce and/or avoid such a degradation of the signal quality in the design of the printed wiring board of the present embodiment, via clearance (e.g., clearance diameter) is controlled.

The via clearance (or clearance) is a minimum distance from a via to another conductor (such as a large-area layer 6) in the direction perpendicular to the axis of the via. The via clearance is a minimum distance from the axis of the via to another conductor (such as the large-area layer 6) in the direction perpendicular to the axis of the via. A large-area layer is a layer having a wide conductive pattern (large-area pattern) for ground or the like. A signal layer is a layer that has a conductive pattern (signal line pattern) narrower than a large-area layer, which is used for signal transmissions.

Figure 5:
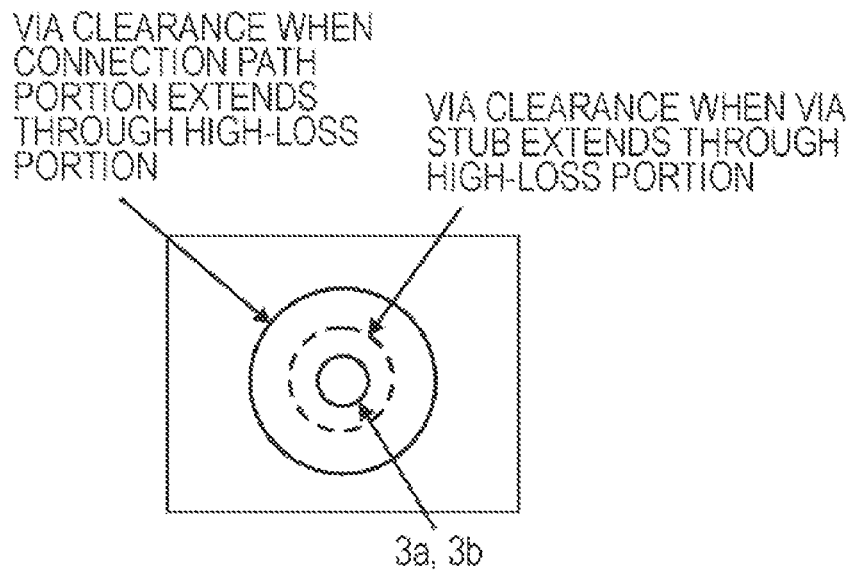
FIG. 5 is a plan view illustrating examples of the via clearance.

FIG. 5 illustrates examples of the via clearance. FIG. 5 is a plan view of the vias 3a and 3b, as viewed from above the surface of the printed wiring board. By changing the via clearance, the apparent capacitance (static capacitance) component of the via stub 7a is changed. That is, for the via stub 7a extending through the high-loss portion 2b, the via clearance is reduced to increase the capacitance component of the via stub 7a. A portion having a large capacitance component has a large energy for charging/discharging, and the attenuation of the high-frequency components due to the dielectric losses is also large. For the connection path portion 7c extending through the high-loss portion 2b, conversely, the via clearance is increased to reduce the capacitance component, thereby reducing the attenuation of the high-frequency components.

The layer structure of the printed wiring board of the present embodiment will now be described.

Figure 6:
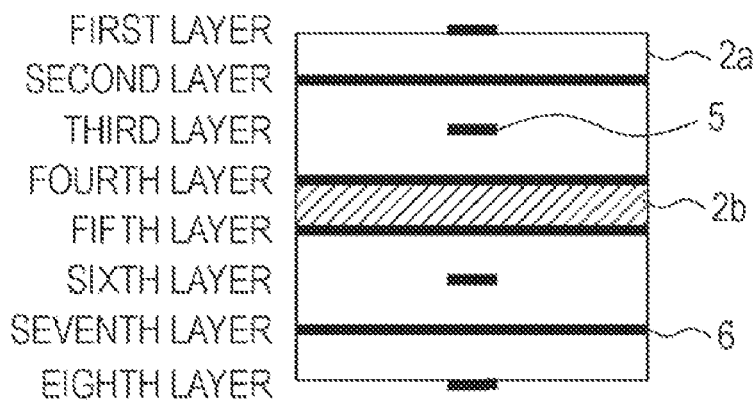
FIG. 6 is a cross-sectional view illustrating an example layer structure of a printed wiring board.

FIG. 6 is a cross-sectional view illustrating an example layer structure of a printed wiring board. The printed wiring board illustrated in FIG. 6 has a total of eight layers. A substrate of the printed wiring board has a high-loss portion 2b between the fourth and fifth layers, and a normal-loss portion 2a used for the other portions. Signal layers 5 are incorporated in the first, third, sixth, and eighth layers. Large-area layers 6 are incorporated in the second, fourth, fifth, and seventh layers.

The control of the via clearance will now be described.

Figure 7:
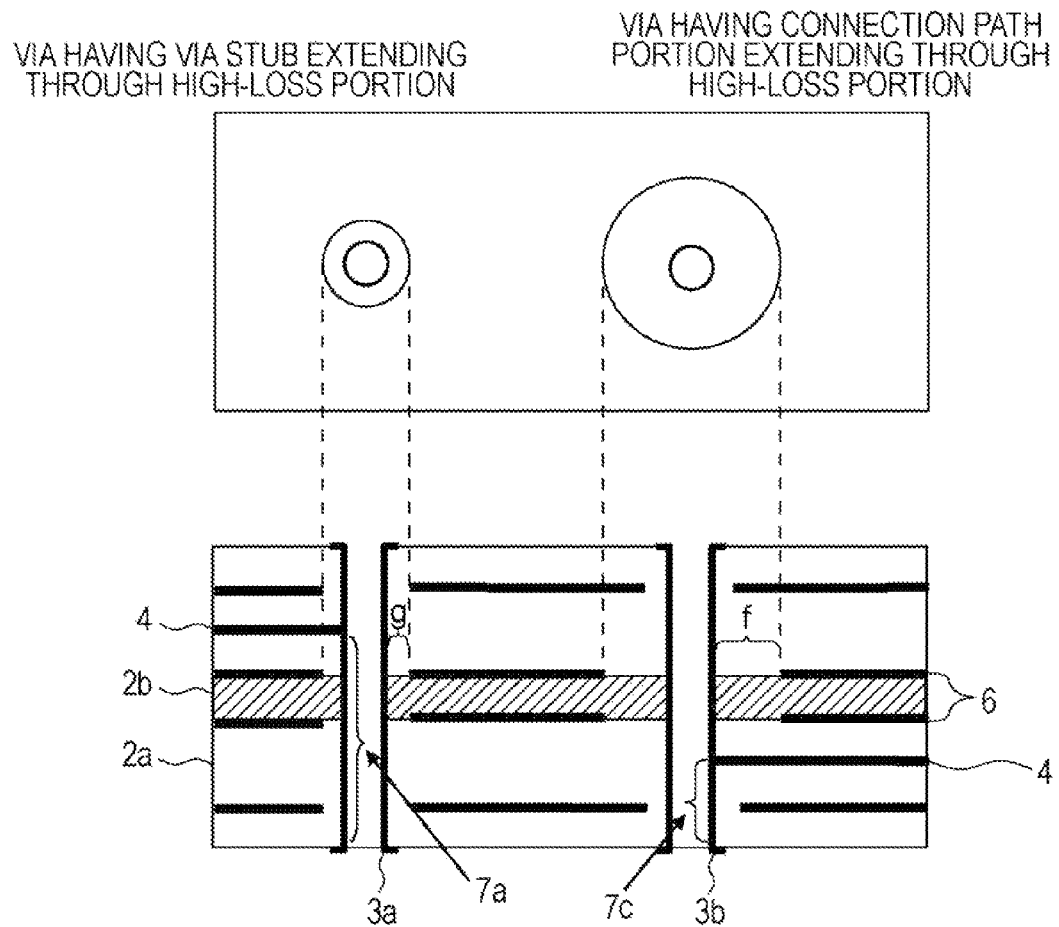
FIG. 7 is a diagram illustrating an example of the control of the via clearance.

FIG. 7 is a diagram illustrating an example of the control of the via clearance. The upper part of FIG. 7 illustrates a plan view as viewed from above the first layer, and the lower part of FIG. 7 illustrates a cross-sectional view. In FIG. 7, the left via is a via having a via stub extending through a high-loss portion, and the right via is a via having a connection path portion extending through the high-loss portion. In FIG. 7, the via clearance control for large-area patterns on the fourth and fifth layers in the example of the printed wiring board described above is illustrated by way of example. In the via clearance control, the via clearance of a via having a via stub extending through a high-loss portion is reduced, and the via clearance diameter of a via having a connection path portion extending through a high-loss portion is increased. For example, in FIG. 7 the via clearance g is smaller than the via clearance f.

The via clearance (e.g., clearance diameter) is determined using the following equations.

For a via having a via stub extending through a high-loss portion:

Via clearance diameter=drill diameter+manufacture-limit conductor gap.

For a via having a connection path portion extending through a high-loss portion:

Via clearance diameter=drill diameter+manufacture-limit conductor gap×coefficient.

On the basis of a wiring rule or the like for the printed wiring board, the design engineer sets the "coefficient" in the above equations for determining the via clearance diameter to a possible maximum value. For example, the initial value may be set to "3".

A printed wiring board design apparatus includes a central processing unit (CPU) and a storage unit (computer-readable recording medium). A printed wiring board design program is stored in the storage unit, and is executed by the CPU.

Figure 8:
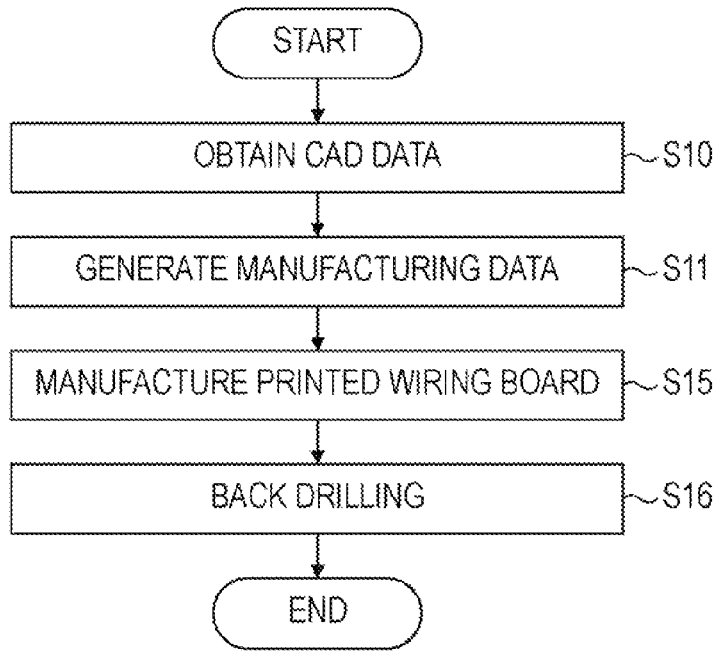
FIG. 8 is a flowchart illustrating an example of a conventional printed wiring board manufacturing method.

FIG. 8 is a flowchart illustrating an example of a conventional printed wiring board manufacturing method. In the manufacturing method, the printed wiring board design apparatus obtains computer-aided design (CAD) data indicating design data of a printed wiring board from the storage unit (S10), and generates manufacturing data on the basis of the CAD data (S11). A printed wiring board manufacturing apparatus manufactures a printed wiring board on the basis of the manufacturing data (S15), and performs a back drilling process (S16). Then, this flow ends. In this printed wiring board manufacturing method, after a printed wiring board is manufactured, a back drilling process is performed to avoid the influence of reflection due to a via stub.

A printed wiring board manufacturing method of the present embodiment will now be described.

Figure 9:
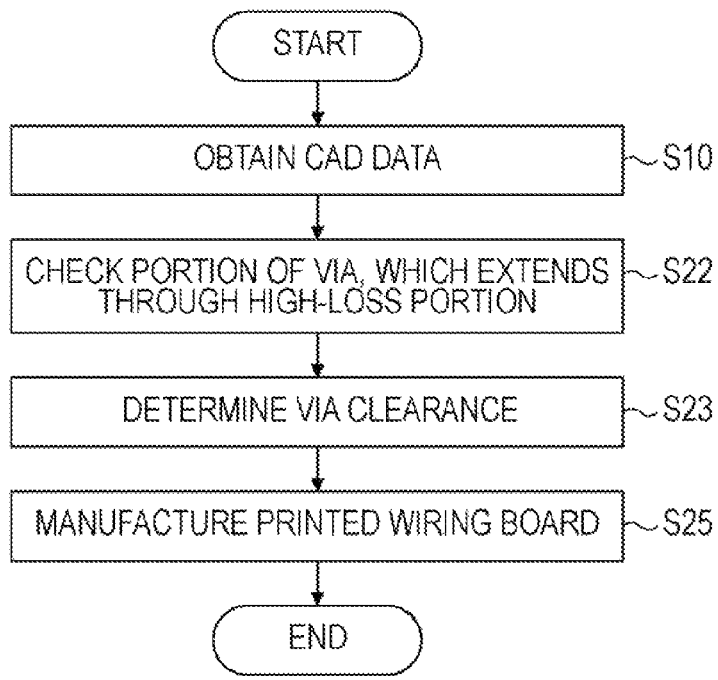
FIG. 9 is a flowchart illustrating a first example of a printed wiring board manufacturing method.

FIG. 9 is a flowchart illustrating a first example of a printed wiring board manufacturing method. FIG. 9 only depicts processes relating to a via stub in the manufacturing method of the present embodiment. In the manufacturing method, the printed wiring board design apparatus obtains CAD data indicating design data of a printed wiring board from the storage unit (S10), checks the CAD data to determine whether a portion of a via, which extends through a high-loss portion, is a via stub or a connection path portion (S22), and changes the via clearance in accordance with a check result to determine the via clearance (S23). The printed wiring board design apparatus further determines which via is set to what via clearance to generate manufacturing data. Next, the printed wiring board manufacturing apparatus manufactures a printed wiring board on the basis of the generated manufacturing data (S25), and the flow ends. The printed wiring board design program causes the CPU of the printed wiring board design apparatus to execute the processing of S22 and S23 described above.

According to the design flow of the present embodiment, the degradation of the waveform quality of a high-frequency signal due to a via stub can be reduced and/or prevented. In contrast to the conventional design flow, the design flow of the present embodiment does not require processing for modifying a printed wiring board after the printed wiring board has been manufactured.

The printed wiring board design apparatus may, in addition to checking wirings on the printed wiring board in substrate design CAD data, perform the processing of S22 and S23 while drawing wirings in substrate design CAD.

Advantages of the present embodiment will now be described.

Here, the normal-loss portion in the printed wiring board may be formed of an FR4 (flame-retardant grade 4: glass board material epoxy resin) copper-clad laminate having a dielectric constant of 4.3 and a dissipation factor of 0.02. The material of a high-loss portion may have a dissipation factor of 2.3.

Figures 10, 11:
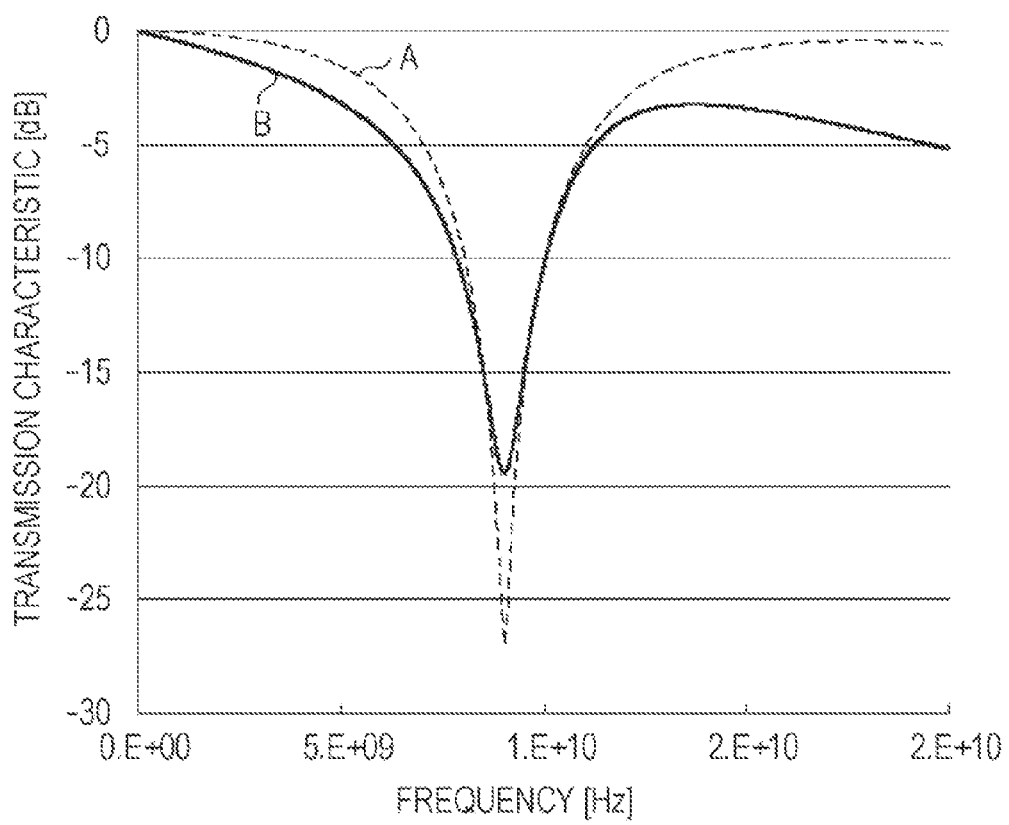
FIG. 10 is a graph illustrating an example of the effect of resonance suppression in a via stub.
FIG. 11 is a table illustrating an example of the effect of resonance suppression in a via stub.

FIG. 10 is a graph illustrating an example of the effect of resonance suppression in a via stub. In the graph, the abscissa represents frequency (in Hz) and the ordinate represents transmittance (transmission characteristic) (in dB). In the graph, A denotes the transmittance of a via stub extending through a multi-layer substrate including only a normal-loss portion, and B denotes the transmittance of a via stub extending through a multi-layer substrate including a normal-loss portion and a high-loss portion provided in the normal-loss portion. A resonance frequency occurs around 9 GHz.

FIG. 11 is a table illustrating an example of the effect of resonance suppression in a via stub. The table represents the dissipation factor of the corresponding layer and the resonance depth in terms of A and B described above. For B, the resonance depth at the resonance frequency, which is about 8 dB less than that for A, can be achieved. In other words, in a via stub extending through a high-loss portion, resonance can be suppressed more than that in a via stub extending through only a normal-loss portion.

FIG. 12 is a graph illustrating an example of the effect of via clearance control. In the graph, the abscissa represents frequency (in Hz) and the ordinate represents transmittance (transmission characteristic) (in dB). In the graph, C denotes the transmittance of a via having a via clearance of 1.24 mm, and D denotes the transmittance of a via having a via clearance of 2.24 mm.

FIG. 13 is a table illustrating an example of the effect of via clearance control. The table represents the via clearance of the corresponding layer and the loss at a frequency of 5 GHz in terms of C and D described above. The transmittance for D is higher than that for C. In other words, the larger the via clearance, the higher the transmittance of the via (the lower the loss).

Second Embodiment

The insertion position of a high-loss portion in a substrate in order to enhance the mounting efficiency differs depending on the wiring density distribution between layers of a printed wiring board and the wiring length of each layer. By determining the insertion position of the high-loss portion, the number of design steps can be reduced.

Figure 14:
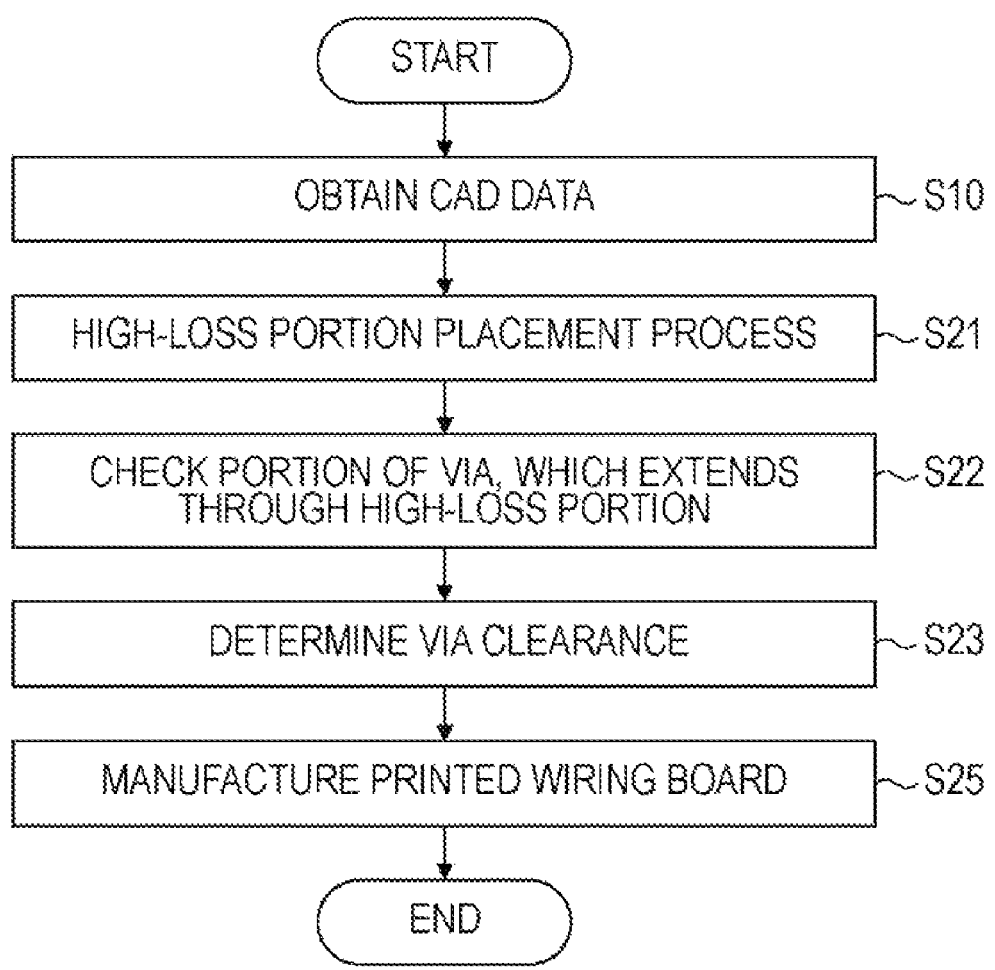
FIG. 14 is a flowchart illustrating a second example of a printed wiring board manufacturing method.

FIG. 14 is a flowchart illustrating a second example of a printed wiring board manufacturing method. In the second example of the printed wiring board manufacturing method, unlike the first example of the printed wiring board manufacturing method, a high-loss portion placement process (S21) is performed before S22.

Figure 15:
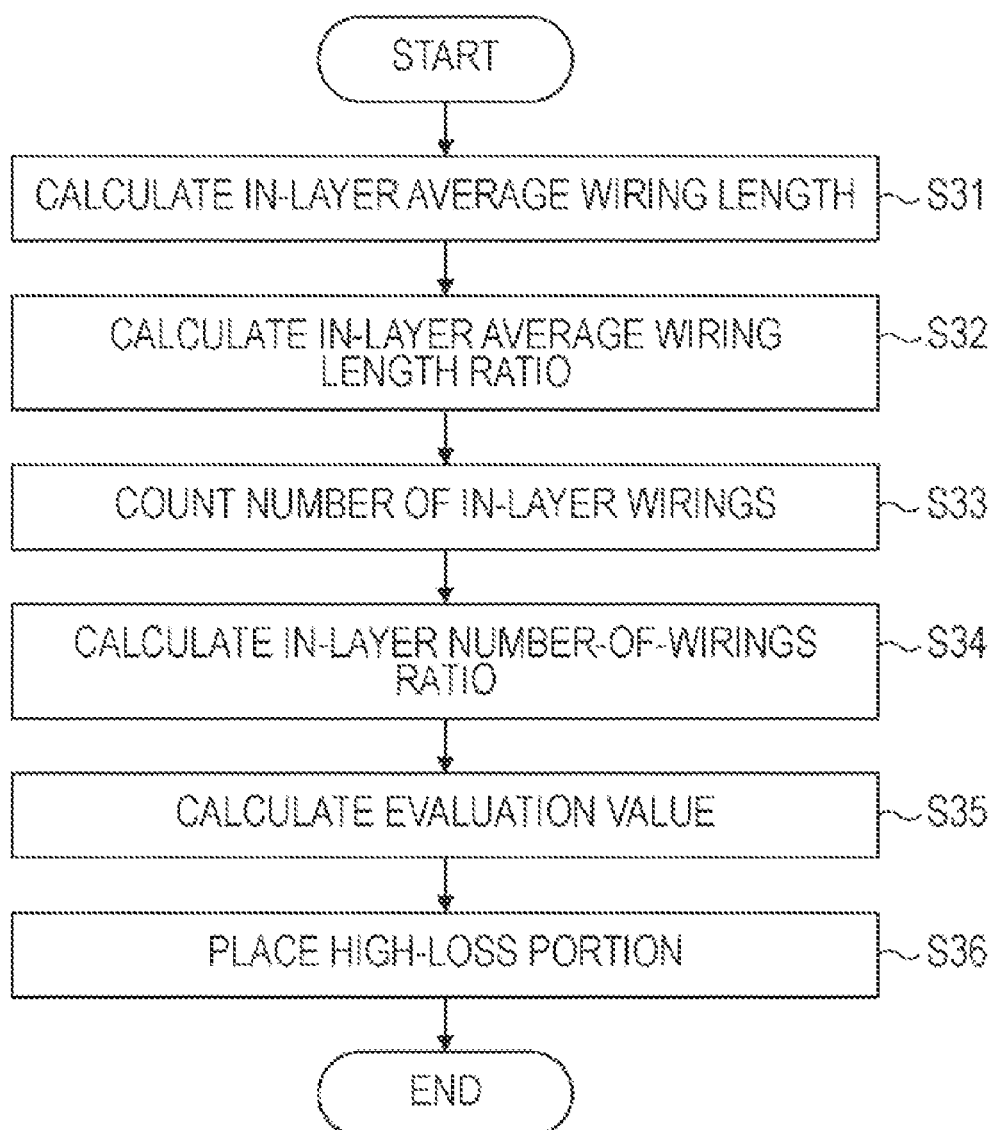
FIG. 15 is a flowchart illustrating an example of a high-loss portion placement process.

FIG. 15 is a flowchart illustrating an example of the high-loss portion placement process. First, the printed wiring board design apparatus calculates the average wiring length of each layer of the printed wiring board in the CAD data to determine an in-layer average wiring length (S31). Then, the printed wiring board design apparatus calculates the maximum value of the in-layer average wiring lengths to determine a maximum in-layer average wiring length, and calculates the ratio of the in-layer average wiring length of each layer to the maximum in-layer average wiring length to determine an in-layer average wiring length ratio (S32). Then, the printed wiring board design apparatus counts the number of wirings of each layer to determine the number of in-layer wirings (S33). Next, the printed wiring board design apparatus calculates the maximum value of the numbers of in-layer wirings to determine the maximum number of in-layer wirings, and calculates the ratio of the number of in-layer wirings of each layer to the maximum number of in-layer wirings to determine an in-layer number-of-wirings ratio (S34). Next, the printed wiring board design apparatus multiplies the in-layer average wiring length ratio by the in-layer number-of-wirings ratio for each layer to calculate an evaluation value (S35). Next, the printed wiring board design apparatus places a high-loss portion on the side of a layer having a maximum evaluation value on which the stub is located (S36), and the flow ends. The evaluation value may be based on the layer wiring length of each layer.

According to the above high-loss portion placement process, the relative index values of the average wiring length and the number of wirings are determined, and the values are multiplied by each other. A layer having the largest multiplication result is regarded as a layer having the largest number of wirings, and a high-loss portion is placed on the side of this layer on which the via stub is located. Therefore, the effect of the high-loss portion can be increased. In S36, the printed wiring board design apparatus may place a high-loss portion on the side of a layer having a maximum evaluation value, which is farther from the surface of the substrate.

Figure 16:
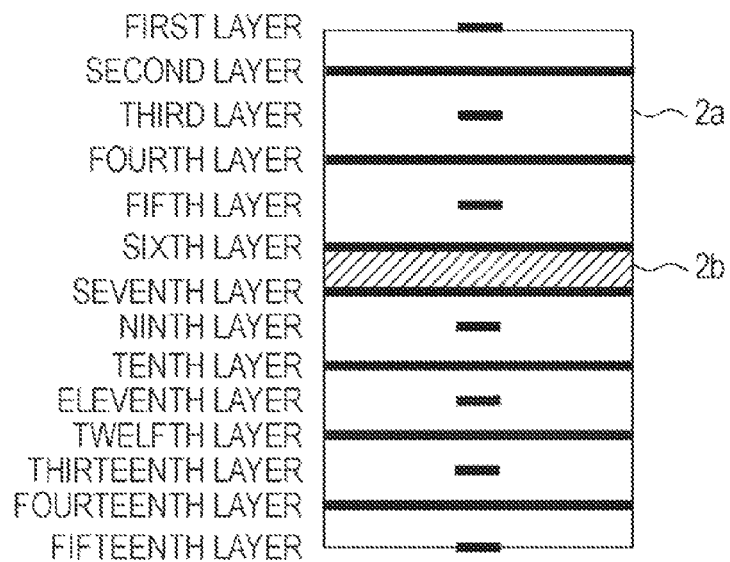
FIG. 16 is a cross-sectional view illustrating an example of the position of a high-loss portion that is placed using the high-loss portion placement process.

FIG. 16 is a cross-sectional view illustrating an example of the position of a high-loss portion that is placed using the high-loss portion placement process. In FIG. 16, the same reference numerals as those in FIG. 3 represent the same or equivalent portions as or to those in FIG. 3, and will not be discussed herein. When the fifth layer is a layer having a maximum evaluation value and a via stub is located below the fifth layer, a high-loss portion 2b is placed on the side of the fifth layer on which the via stub is located.

Figure 17:
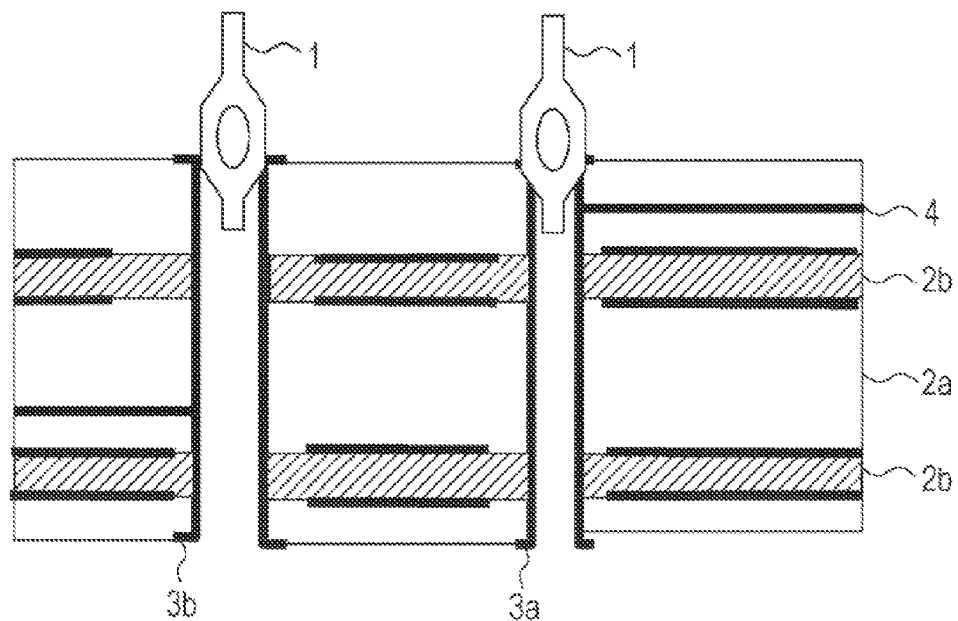
FIG. 17 is a cross-sectional view illustrating an example of a printed wiring board having a plurality of high-loss portions.

In the embodiments described above, a plurality of high-loss portions 2b can be provided in a substrate, whereby the characteristics of more wirings can be improved. FIG. 17 is a cross-sectional view illustrating an example of a printed wiring board having a plurality of high-loss portions. In FIG. 17, the same reference numerals as those in FIG. 1 represent the same or equivalent portions as or to those in FIG. 1, and will not be discussed herein. In the printed wiring board illustrated in FIG. 17, two high-loss portions 2b are provided in a normal-loss portion 2a.

A high-loss portion may not necessarily be provided on an entirety of a layer but may be provided only in a specific region such as near a via stub. Alternatively, a high-loss portion may be provided on the surface of a substrate on which a via stub is located, instead of within a normal-loss portion.

According to the embodiments described above, in the manufacture of a printed wiring board, reflection of the high-frequency components, which is caused by the branched shape of a through-hole, can be suppressed. When printed wiring boards are laminated, a predetermined layer contains an insulating material having a high dissipation factor (high loss). Therefore, a through-hole in which reflection due to a via stub is suppressed can be realized at low cost without increasing the number of steps in the printed wiring board manufacturing process, and the signal waveform quality in a printed wiring board can be improved. The waveform quality can further be improved by controlling the via clearance.

Figure 18:
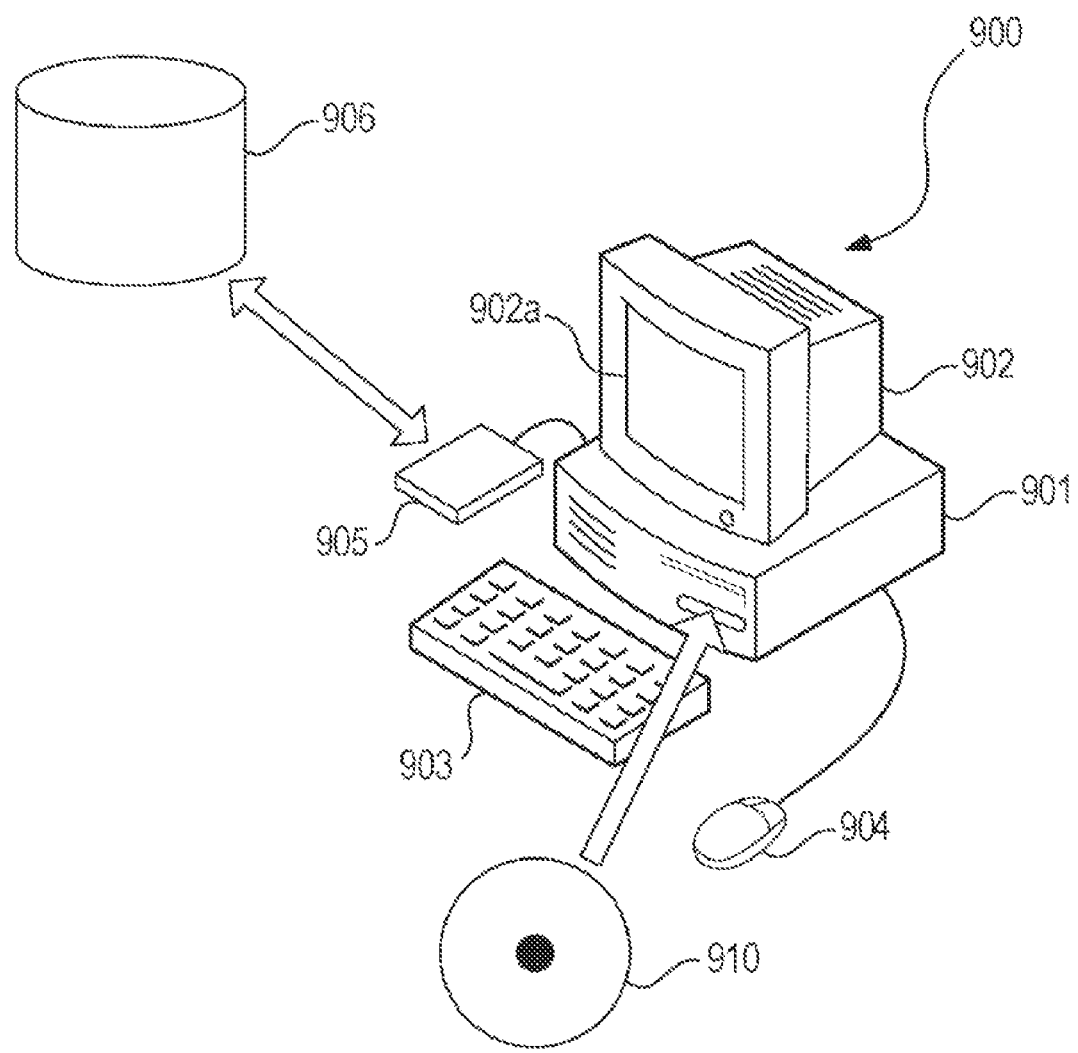
FIG. 18 is a diagram illustrating an example of a computer system used in the present embodiments.

FIG. 18 is a diagram illustrating an example of a computer system used in the present embodiments. A computer system 900 illustrated in FIG. 18 includes a main body 901 including a CPU, a disk drive, and any other suitable device, a display 902 configured to display an image in accordance with an instruction given from the main body 901, a keyboard 903 used to input various types of information to the computer system 900, a mouse 904 used to specify a desired position on a display screen 902a of the display 902, and a communication device 905 configured to access an external database or the like to download a program and the like stored in another computer system. The communication device 905 may be implemented by a network communication card, a modem, or any other suitable device.

A program for causing a computer system that constitutes a printed wiring board design apparatus as described above to execute the individual steps described above can be provided as a printed wiring board design program. The program is stored in a computer-system-readable recording medium so that a computer system that constitutes a printed wiring board design apparatus can execute the program. A program for executing the individual steps described above is stored in a portable recording medium such as a disk 910, or is downloaded from a recording medium 906 in another computer system using the communication device 905. Further, a printed wiring board design program for causing the computer system 900 to have at least a printed wiring board design function is input to the computer system 900 and compiled. The program stored in a computer-readable recording medium, for example, the disk 910, causes the computer system 900 to operate as a printed wiring board design system having a printed wiring board design function. Here, examples of the recording medium that can be read by the computer system 900 include an internal storage device internally mounted in a computer, such as a read-only memory (ROM) or a random access memory (RAM), a portable storage medium such as the disk 910, a flexible disk, a digital versatile disk (DVD), a magneto-optical disk, or an integrated circuit (IC) card, a database storing computer programs, another computer system and a database thereof, and various computer-system-accessible recording media connected through a communication means such as the communication device 905.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A multi-layer printed wiring board comprising:
   a first insulating layer;
   a second insulating layer having a dielectric dissipation factor higher than a dielectric dissipation factor of the first insulating layer and having the dielectric dissipation factor being equal to or greater than 2.3;
   a first conductive layer including a lead wire; and
   a first via connected to the lead wire, the first via including a stub extending through the second insulating layer.

2. The multi-layer printed wiring board according to claim 1, wherein the second insulating layer, through which the stub extends, is formed so as to suppress resonance caused by the stub.

3. The multi-layer printed wiring board according to claim 1, further comprising:
   a second conductive layer arranged on the second insulating layer;
   a second via including a non-stub portion extending through the second insulating layer, the non-stub portion being a portion that does not form a stub,
   wherein a distance between the non-stub portion of the second via and a second conductive layer is greater than a distance between the first via and a the second conductive layer.

4. The multi-layer printed wiring board according to claim 1, wherein the second insulating layer is provided on a side of a conductive layer, the side being a side on which the stub of the first via is located.

5. The multi-layer printed wiring board according to claim 1, wherein the first via includes a conductor that covers an entirety of an inner wall of a hole formed in the multi-layer printed wiring board.

6. The multi-layer printed wiring board according to claim 1, wherein the stub has an end that is not electrically connected.

* * * * *